US008743623B2

(12) United States Patent
Cho et al.

(10) Patent No.: US 8,743,623 B2
(45) Date of Patent: Jun. 3, 2014

(54) APPARATUS AND METHODS OF BIT LINE SETUP

(75) Inventors: Myung Cho, Icheon-si (KR); Seong Je Park, Suwon-si (KR); Jung Hwan Lee, Suwon-si (KR)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 13/195,548

(22) Filed: Aug. 1, 2011

(65) Prior Publication Data

US 2013/0033940 A1 Feb. 7, 2013

(51) Int. Cl.
*G11C 16/10* (2006.01)
*G11C 16/06* (2006.01)

(52) U.S. Cl.
USPC .................................. 365/185.25; 365/185.18

(58) Field of Classification Search
None
See application file for complete search history.

(56) References Cited

U.S. PATENT DOCUMENTS 5,768,193 A * 6/1998 Lee et al. ................. 365/185.25
2008/0186773 A1* 8/2008 Bergemont et al. ...... 365/185.18
2010/0182841 A1* 7/2010 Lee .......................... 365/185.21

* cited by examiner

*Primary Examiner* — Hoai V Ho
*Assistant Examiner* — James G Norman
(74) *Attorney, Agent, or Firm* — Schwegman, Lundberg & Woessner, P.A.

(57) ABSTRACT

Methods and apparatus are disclosed, including an apparatus that has a memory cell array with a memory cell selectively coupled to a bit line. A control circuit is configured to provide a control signal. A voltage generator is configured to provide a sense signal and a precharge signal in response to the control signal. The apparatus further includes a page buffer configured to provide a bit line voltage to the bit line based on the sense signal and the precharge signal, to thereby control a programming of the memory cell.

19 Claims, 8 Drawing Sheets

APPARATUS AND METHODS OF BIT LINE SETUP

TECHNICAL FIELD

The present disclosure relates generally to programming memory and, in particular, to a bit line setup scheme for memory.

BACKGROUND

Recently, there has been an increasing demand for non-volatile memory devices such as a flash memory which can be electrically programmed and erased. Non-volatile memory devices are widely used in storage media for portable electronic devices, such as digital televisions, digital cameras, personal digital assistants (PDAs), and MP3 players.

Typically, non-volatile memory devices include an array of cells and bit lines and word lines to control the programming operations of the cells. To perform a program operation in a non-volatile memory device, a bit line setup operation is performed, in advance, to provide a voltage to a bit line according to a programming state of a cell coupled to the bit line. As a result of the bit line setup operation, the cell connected to the bit line may be distinguished typically from among the following types of cells: a cell to be programmed, a cell inhibited from being programmed, and a cell to be slowly programmed.

DETAILED DESCRIPTION

Figure 1:
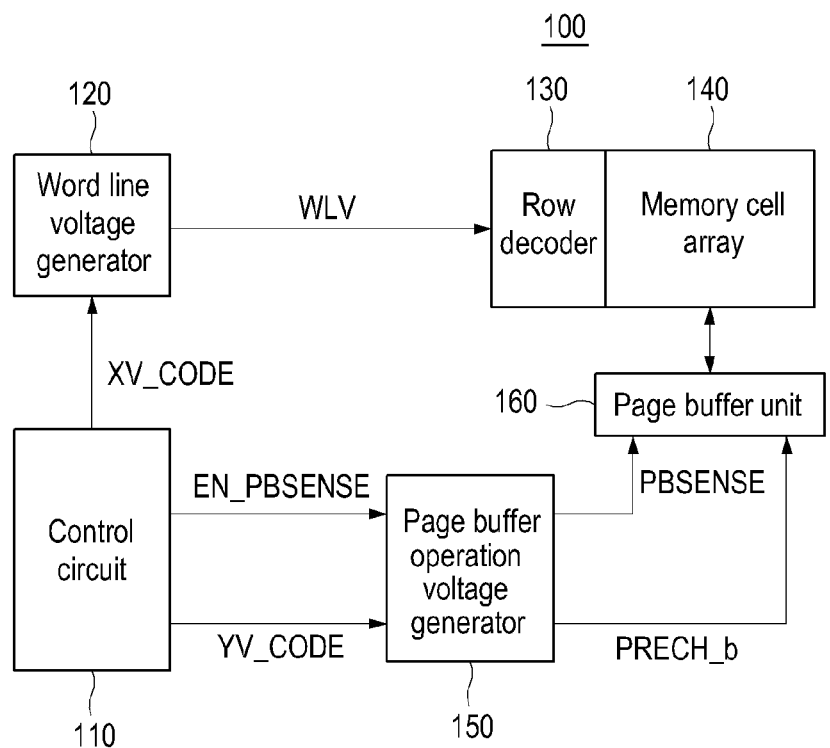
FIG. 1 is a schematic diagram of an illustrative embodiment of a non-volatile memory device.

To perform a bit line setup operation, one or more sequential steps should be performed to provide (e.g., apply, generate, output, transfer, or the like) a corresponding bit line voltage to the bit line according to the type of cells coupled to the bit line. The more sequential steps involved in performing the bit line set up operation, the longer the bit line setup operation takes, resulting in larger current consumption.

In performing the bit line setup operation, the current consumption and the required operation time become significant factors to determine the efficiency of the overall performance of the bit line setup operation. Therefore, in some cases reduction in the number of steps for a bit line setup operation results in a reduction in the overall current consumption and shortens the bit line setup time.

In one embodiment, an apparatus (e.g., a circuit, device, such as a non-volatile memory device, or a system including such a device) includes a memory cell array including a memory cell configured to be coupled to a bit line, a control circuit configured to provide a control signal, and a voltage generator configured to provide a sense signal and a precharge signal in response to the control signal. The apparatus further includes a page buffer configured to provide a bit line voltage to the bit line based on the sense signal and the precharge signal, to thereby control a programming of the memory cell. The page buffer can include a program unit including a latch unit configured to store first data. The program unit may be configured to provide a program voltage as the bit line voltage to the bit line to program a cell coupled to the bit line based on (e.g., according to, depending on, in response to, or the like) the first data. The page buffer can further include a non-program unit configured to store second data and to provide a bias voltage as the bit line voltage to the bit line based on the second data. The page buffer can further include a dynamic program unit configured to provide an intermediate voltage as the bit line voltage to the bit line based on program data including the first data and the second data.

The foregoing embodiment is illustrative only and is not intended to be in any way limiting. In addition to the illustrative aspects, embodiments, and features described above, further aspects, embodiments, and features will become apparent by reference to the drawings and the following detailed description.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the embodiments of the present disclosure, as generally described herein, and illustrated in the Figures, can be arranged, substituted, combined, separated, and designed in a wide variety of different configurations, all of which are explicitly contemplated herein.

FIG. 1 is a schematic diagram of an illustrative embodiment of a conventional non-volatile memory device 100. As depicted, the nonvolatile memory device 100 includes a control circuit 110, a word line voltage generator 120, a row decoder 130, a memory cell array 140, a page buffer operation voltage generator 150, and a page buffer unit 160. The control circuit 110 is configured to provide a first code signal XV_CODE to the word line voltage generator 120 and provide a sense enable signal EN_PBSENSE and a second code signal YV_CODE to the page buffer operation voltage generator 150. The word line voltage generator 120 is configured to provide a word line voltage WLV to the row decoder 130 in response to the first code signal XV_CODE. The row decoder 130 is configured to provide the word line voltage WLV to a word line of the memory cell array 140. The memory cell array 140 may have an all-bit line (ABL) structure, an even-odd bit line structure, or the like.

The page buffer operation voltage generator 150 is configured to provide a sense signal PBSENSE and a precharge signal PRECH_b, which are provided during a programming operation (which will be described in detail later), in response to the sense enable signal EN_PBSENSE and the second code signal YV_CODE provided by the control circuit 110. The page buffer unit 160 is configured to control a programming of the bit line coupled to a cell in the memory cell array 140. The page buffer unit 160 is further configured to store program data. The page buffer unit 160 may provide a bit line voltage to the bit line in response to the sense signal PBSENSE and the precharge signal PRECH_b according to the program data.

It should be appreciated that the non-volatile memory device 100 may include any type of memory units/modules that can store, program and erase data. For example, the non-volatile memory device 100 may include but is not limited to a NAND memory, a flash memory, a NOR memory, or the like.

Figure 2:
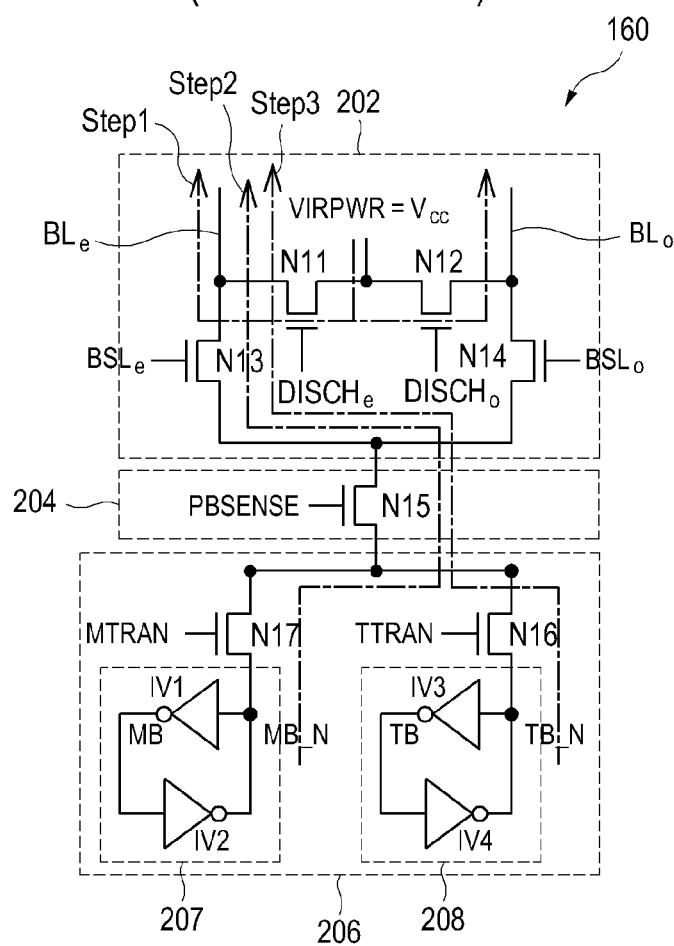
FIG. 2 shows an illustrative embodiment of a page buffer.
Figure 3:
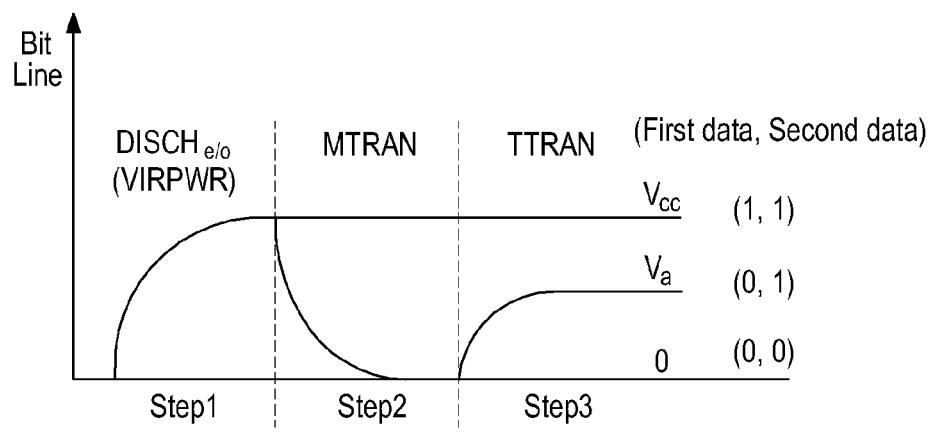
FIG. 3 shows a waveform of a bit line voltage when a bit line setup operation of a non-volatile memory is performed in three steps using the page buffer.

Conventionally, the non-volatile memory device 100 is configured to perform a bit line setup operation in three sequential steps (Step 1, Step 2, Step 3) using the page buffer 160, as illustrated in FIGS. 2 and 3. The page buffer 160 may include a bit line selection unit 202, a bit line sensing unit 204, and a data latch unit 206. The data latch unit 206 may include a first latch 207 and a second latch 208. The bit lines (e.g., $BL_e$ and $BL_o$) are precharged with a virtual power voltage (VIRPWR=$V_{cc}$) while providing $V_{cc}$ as a discharge signal $DISCH_e$ and $DISCH_o$ to NMOS transistors N11 and N12, respectively (Step 1). At Step 1, the bit lines (e.g., $BL_e$ and $BL_o$) are precharged to have a voltage level of $V_{cc}$, which may have the voltage of, e.g., 2.3 V. A bit line coupled to a cell to be programmed is discharged based on program data stored in the first latch 207 while providing $V_{cc}$ as a main transfer signal MTRAN to a NMOS transistor N17 and a page buffer sense signal PBSENSE to a NMOS transistor N15 (Step 2). At Step 2, when the data stored in the first latch 207 (first data) is 0, a bit line of a cell to be programmed is discharged to a voltage level of 0. A bit line coupled to a cell to be slowly programmed is charged based on data stored in the second latch 208 (second data) while providing an intermediate voltage $V_a$ (which has the value between 0V and $V_{cc}$) as a page buffer sense signal PBSENSE to the NMOS transistor N15 and providing $V_{cc}$ as a temp transfer signal TTRAN to a NMOS transistor N16 (Step 3). The data latch unit 206 is configured to temporarily store second data that is provided based on the precharge signal PRECH_b. For example, the data latch unit 206 may store 0 as the second data when the precharge signal PRECH_b is $V_{cc}$, and the data latch unit 206 may store 1 as the second data when the precharge signal PRECH_b is 0. At Step 3, when the data stored in the second latch 208 (second data) is 1, a bit line of a cell to be slowly programmed is charged to a voltage level of $V_a$. After performing the above three steps, the bit line has one of the voltage levels $V_{cc}$, $V_a$, and 0 according to the combination of the first data and the second data ("11" "01" and "00" respectively), a shown in FIG. 3.

Since the above bit line setup operation is divided into three steps, it takes a relatively long time to complete the bit line setup operation. Moreover, since all bit lines are precharged at Step 1, much current is consumed to charge all the bit lines (e.g., due to the capacitance of the bit lines) and extra current is necessary to charge the bit line again to the level of $V_a$ for the cell to be slowly programmed at Step 3. Other embodiments reduce the number of steps involved in the bit line setup operation to thereby shorten the bit line set up time and/or reduce the current consumption. In some instances this is accomplished by reducing the number of steps taken in the bit line set up operation.

Figure 4:
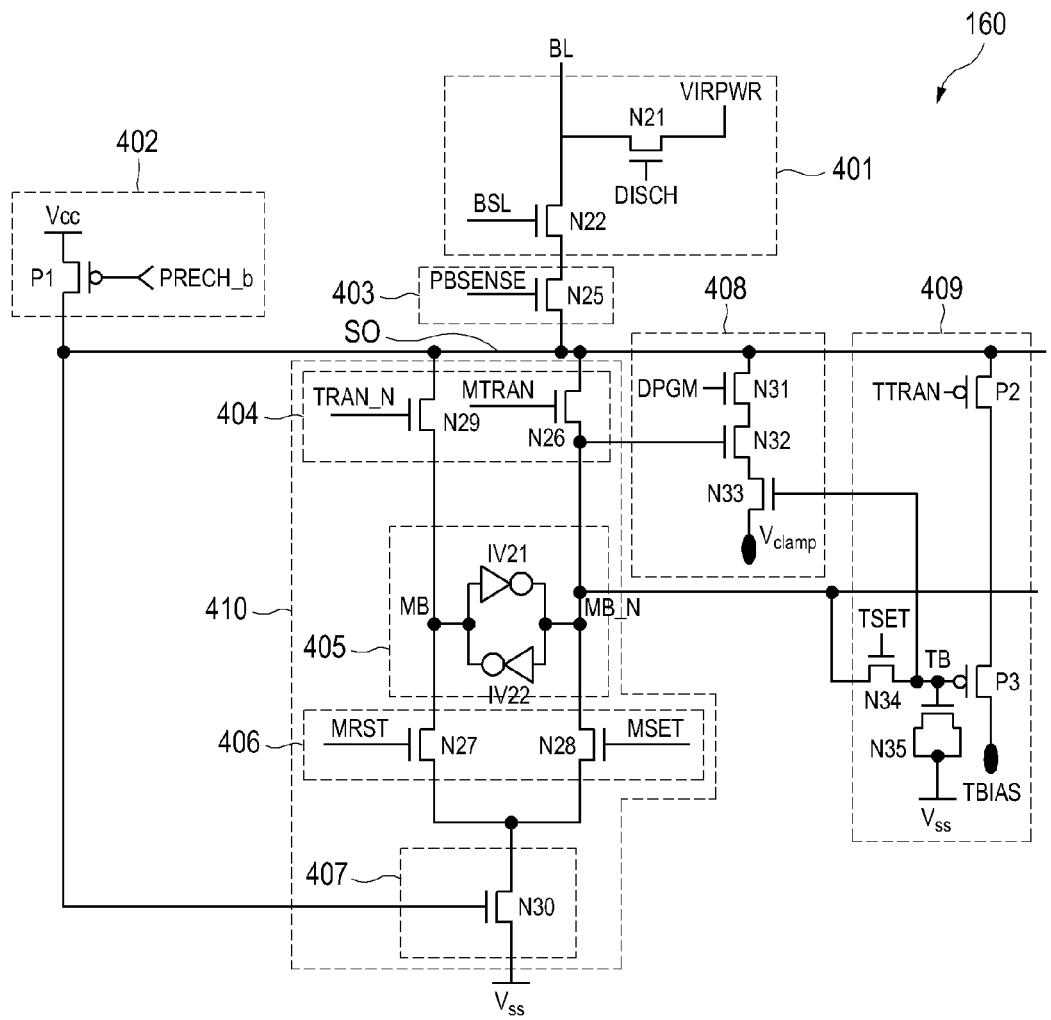
FIG. 4 shows another illustrative embodiment of a page buffer.

FIG. 4 shows another illustrative embodiment of a page buffer (e.g., the page buffer unit 160 of FIG. 1) to perform a one-step bit line setup operation. As depicted, the page buffer unit 160 may include a bit line selection unit 401, a sense node precharge unit 402, a bit line sense unit 403, a program unit (PGM unit) 410, a dynamic program unit (DPGM unit) 408, and a non-program unit (NPGM unit) 409. The DPGM unit 408, the NPGM unit 409, and the PGM unit 410 may be configured to provide a bit line voltage to a bit line BL through a sense node SO in response to program data. The DPGM unit 408 is configured to provide an intermediate voltage $V_a$ to the sense node SO in response to program data that is provided to the page buffer 160. The program data may include first data stored at a first node MB_N of the PGM unit 410 and the second data stored at a third node TB of the NPGM unit 409. For example, the combination of the first data and the second data may indicate the program data. The NPGM unit 409 is configured to provide a bias voltage TBIAS to the sense node SO in response to program data (second data) stored at the third node TB. The PGM unit 410 is configured to provide a program voltage (e.g., 0V) as a bit line voltage to a bit line BL through the sense node SO to program a cell coupled to the bit line BL in response to first data stored at a first node MB_N.

In some embodiments, the PGM unit 410 may include a data transmission unit 404, a data latch unit 405, a data set unit 406, and a sense node sense unit 407. The data latch unit 405 is configured to temporarily store read data that is read from a specific cell, or program data that is provided through the operations of the data set unit 406, and the sense node sense unit 407. The data transmission unit 404 is configured to provide the sense node SO with the program data stored in the data latch unit 405, in response to a program operation being performed. The data set unit 406 is configured to input data to be stored in the data latch unit 405. The sense node sense unit 407 is configured to provide a specific node (e.g., first node MB_N, second node MB) of the data latch unit 405 with a ground voltage $V_{SS}$ in response to a voltage level of the sense node SO. In this way, the PGM unit 410 is configured to provide a program voltage (e.g., 0V) as a bit line voltage to a bit line BL through the sense node SO to program a cell coupled to the bit line BL.

The data latch unit 405 is configured to temporarily store program data (e.g., first data) to be programmed into a specific memory cell or to temporarily store data read from a specific memory cell. To this end, the data latch unit 405 may include a first inverter IV21 and a second inverter IV22. The output node of the first inverter IV21 is coupled to the input node of the second inverter IV22, and the output node of the second inverter IV22 is coupled to the input node of the first inverter IV21. A node at which the output node of the first inverter IV21 is coupled to the input node of the second inverter IV22 is called a first node MB_N. A node at which the output node of the second inverter IV22 is coupled to the input node of the first inverter IV21 is called a second node MB.

For example, in response to data of a high level being provided to the first node MB_N, the corresponding data are reversed by the second inverter IV22, so that data of a low level are provided to the second node MB. The data of a low level are reversed by the first inverter IV21, and accordingly, the data of a high level, provided to the first node MB_N, remain intact. Accordingly, a data storage effect is provided. On the other hand, in response to data of a low level being provided to the first node MB_N, the corresponding data are reversed by the second inverter IV22, so that data of a high level are provided to the second node MB. The data of a high level are reversed by the first inverter IV21, and accordingly, the data of a low level, provided to the first node MB_N, remain intact. Accordingly, a data storage effect is provided.

The data transmission unit 404 is configured to selectively provide the sense node SO with data stored in the first node MB_N or the second node MB of the data latch unit 405. To this end, the data transmission unit 404 includes a first transfer transistor N26 configured to selectively couple the first node MB_N to the sense node SO and a second transfer transistor N27 to selectively couple the second node MB to the sense node SO. The first transfer transistor N26 is configured to provide data, stored in the first node MB_N, to the sense node SO in response to a first data transfer signal MTRAN. Furthermore, the second transfer transistor N27 is configured to provide data, stored in the second node MB, to the sense node SO in response to a second data transfer signal TRAN_N. Accordingly, in response to the first data transfer signal MTRAN of a high level being provided to the first transfer transistor N26, the data stored in the first node MB_N is provided to the sense node SO. In response to the second data transfer signal TRAN_N of a high level being provided to the second transfer transistor N27, the data stored in the second node MB being provided to the sense node SO.

The data set unit 406 includes a first data set transistor N28 configured to provide a ground voltage $V_{SS}$ to the first node MB_N of the data latch unit 405. The data set unit 406 includes a second data set transistor N27 configured to provide the ground voltage $V_{SS}$ to the second node MB. The first data set transistor N28 is coupled between the sense node sense unit 407 and the first node MB_N. The first data set transistor N28 is configured to provide the first node MB_N with the ground voltage $V_{SS}$, received from the sense node sense unit 407, in response to a first data set signal MSET. Furthermore, the second data set transistor N27 is coupled between the sense node sense unit 407 and the second node MB. The second data set transistor N27 is configured to provide the second node MB with the ground voltage $V_{SS}$, received from the sense node sense unit 407, in response to a second data set signal MRST.

The sense node sense unit 407 is configured to provide the ground voltage VSS to the data set unit 406 in response to a voltage level of the sense node SO. To this end, the sense node sense unit 407 includes an NMOS transistor N30 coupled between the data set unit 406 and a node for the ground voltage $V_{SS}$. Accordingly, the sense node sense unit 407 provides the ground voltage $V_{SS}$ to the data set unit 406 in response to a voltage level of the sense node SO. The sense node sense unit 407 provides the ground voltage $V_{SS}$ to the data set unit 406 only when a voltage level of the sense node SO is at a high level. When the first data set signal MSET of a high level is received, the ground voltage VSS is provided to the first node MB_N. Accordingly, data of a low level are provided to the first node MB_N. In response to the second data set signal MRST of a high level being received, the ground voltage VSS is provided to the second node MB. Accordingly, data of a high level are provided to the first node MB.

The NPGM unit 409 is configured to provide a bias voltage TBIAS to the sense node SO in response to program data (second data) stored in a third node TB. The NPGM unit 409 may include a third data set transistor N34. The third data set transistor N34 is coupled between the first node MB_N and the third node TB. The third data set transistor N34 is configured to provide the third node TB with the voltage at the first node MB_N in response to a third data set signal TSET. When the third data set signal TSET of a high level is received, the voltage at the first node MB_N is provided to the third node TB. The NPGM unit 409 includes a NMOS transistor N35 to maintain the voltage at the third node TB. The NMOS transistor N35 serves as a dynamic second latch that stores second data corresponding to the voltage at the third node TB. After providing the voltage to the third node TB, the third data set signal TSET of a low level is received, and the voltage at the first node MB_N may be set again through the operations of the data set unit 406 and the sense node sense unit 407 according to the above-described processes. In this way, the combination of program data (first data corresponding to the voltage at the first node MB_N, and second data corresponding to the voltage at the third node TB) may be stored at the first node MB_N and the third node TB.

The NPGM unit 409 may include a PMOS transistor P3 and a third transfer transistor P2. The PMOS transistor P3 is configured to couple a bias node having the voltage of a bias voltage TBIAS to the third transfer transistor P2 in response to the second data (i.e., voltage at the third node TB). When the second data has a low level (e.g., 0V), the PMOS transistor P3 may provide a bias voltage TBIAS to the third transfer transistor P2. The third transfer transistor P2 is configured to couple the PMOS transistor P3 to the sense node SO in response to a third data transfer signal TTRAN. In response to the third data transfer signal TTRAN of a low level being provided to the third transfer transistor P2, the bias voltage TBIAS may be provided to the sense node SO.

The DPGM unit 408 is configured to provide an intermediate voltage $V_a$ (which has the value between 0V and $V_{cc}$) to the sense node SO in response to the program data having the first data and the second data. The DPGM unit 408 includes NMOS transistors N31, N32, N33 that are coupled in series between the sense node SO and a clamp node to which a clamp voltage $V_{clamp}$ is provided. The NMOS transistor N33 is configured to provide the clamp voltage $V_{clamp}$ to the NMOS transistor N32 in response to the second data (i.e., voltage at the third node TB). The NMOS transistor N32 may couple the NMOS transistor N33 to the NMOS transistor N31 in response to the first data (i.e., voltage at the first node MB_N). The NMOS transistor N31 may provide an intermediate voltage $V_a$ (corresponding to the clamp voltage $V_{clamp}$) to the sense node SO in response to a dynamic program signal DPGM.

The bit line selection unit 401 is configured to selectively couple a sense node SO to a bit line BL coupled to a specific memory cell of the memory cell array 140. The bit line selection unit 401 includes a NMOS transistor N22. The NMOS transistor N22 is configured to couple the bit line BL to the sense node SO via the bit line sense unit 403 in response to a first bit line selection signal BSL. The bit line selection unit 401 may further include an NMOS transistor N21 as a control signal input node. The control signal input node is configured to provide a control signal VIRPWR of a specific level such as 2.3 V. The NMOS transistor N21 is configured to couple the bit line BL to the control signal input node in response to a discharge signal DISCH.

The bit line sense unit 403 is configured to selectively couple the bit line selection unit 401 to the sense node SO in response to the sense signal PBSENSE. To this end, the bit line sense unit 403 includes an NMOS transistor N25 coupled between the bit line selection unit 401 and the sense node SO. The bit line sense unit 403 is configured to provide a voltage at the sense node SO to the bit line selection unit 401.

The sense node precharge unit 402 is configured to provide the sense node SO with a high level power supply voltage $V_{cc}$ in response to the precharge signal PRECH_b. To this end, the sense node precharge unit 402 includes a PMOS transistor P1 coupled between a node for the power supply voltage $V_{cc}$ and the sense node SO. The sense node precharge unit 402 is configured to provide a high level power supply voltage $V_{cc}$ to the sense node sense unit 407.

It should be appreciated that although a specific type of electronic elements (NMOS transistor, PMOS transistor and inverter) are referenced in the above embodiment, other types of elements may be used without limitations. For example, depending on the implementation requirements, the NMOS and PMOS may be exchanged and other types of latches may be employed as the data latch unit 405.

Figure 5:
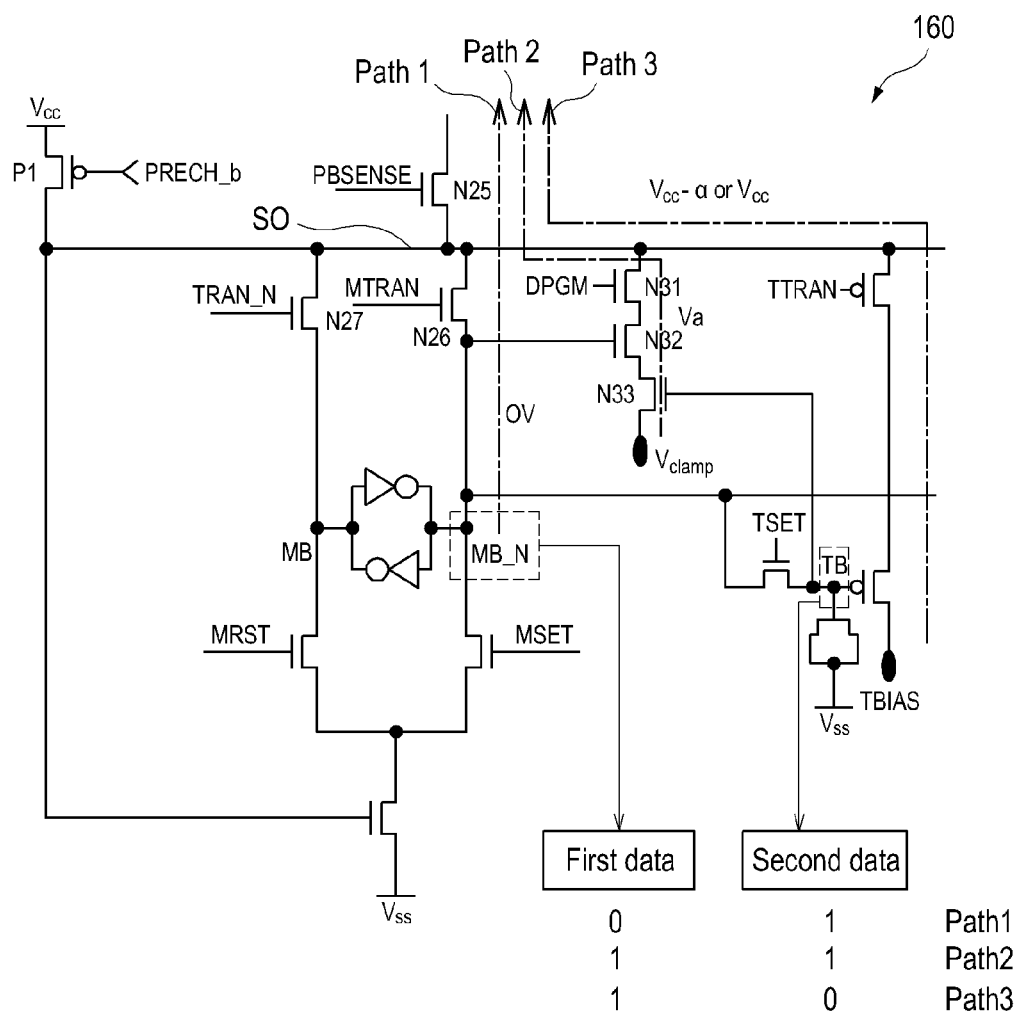
FIG. 5 shows an illustrative embodiment of the bit line setup operation with the page buffer.
Figure 6:
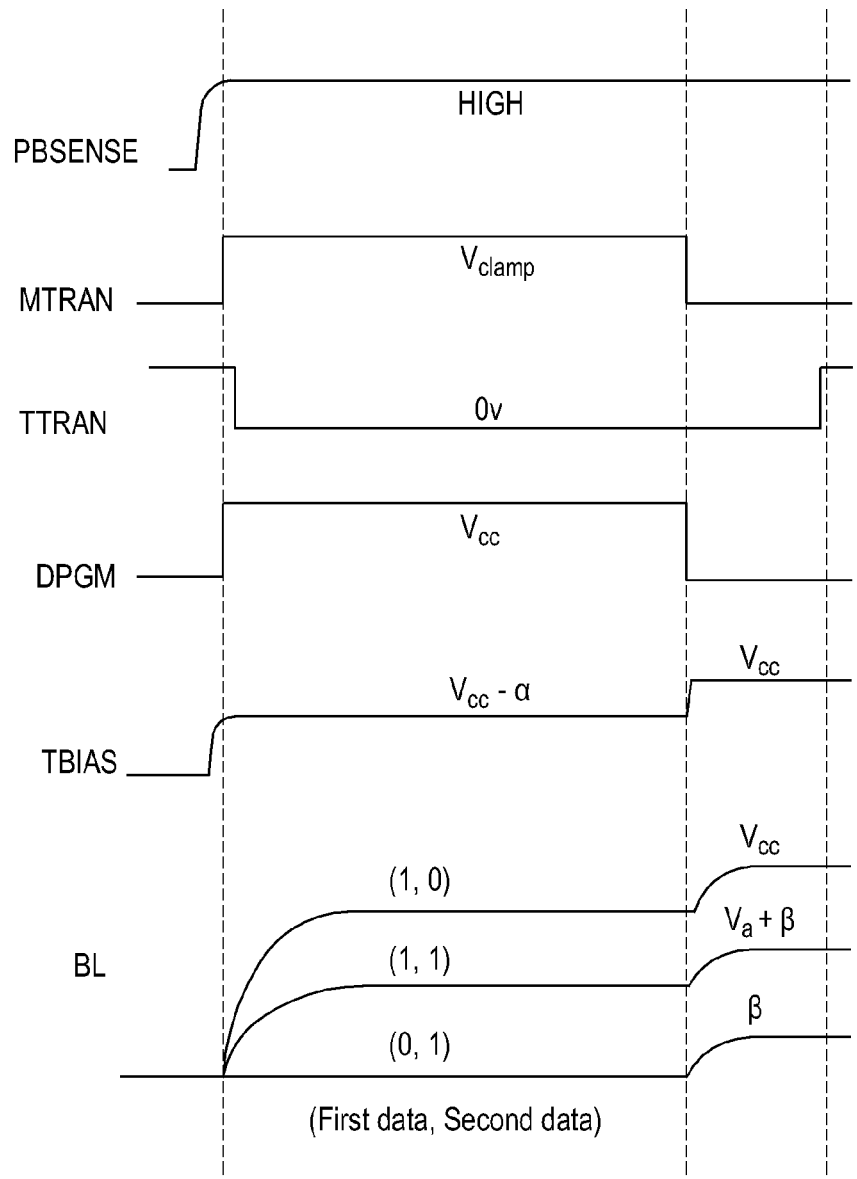
FIG. 6 shows a waveform of signals provided when the bit line setup operation with the page buffer is performed.

The bit line setup operation of the non-volatile memory device in one embodiment is described below with reference to FIGS. 5 and 6. A controller (e.g., the control circuit of FIG. 1) can generate signals to control the bit line setup operation. For example, the page buffer operation voltage generator 150 may be configured to provide a sense signal PBSENSE, the first data transfer signal MTRAN, the second data transfer signal TRAN_N, dynamic program signal DPGM, and the bias voltage TBIAS under the control of the control circuit 110. As depicted in FIG. 5, the page buffer 160 is configured to provide the bit line voltage in three different paths depending on the combination of the first data (stored at the first node MB_N) and the second data (stored at the third node TB). When the combination of the first data and the second data (first data, second data) is (0, 1), the first node MB_N (having the voltage level of 0V) is coupled to the bit line through Path 1. In case of (0, 1), the voltage at the first node MB_N is provided to the sense node SO in response to the first data transfer signal MTRAN. The first data transfer signal MTRAN may have a voltage level that enables the NMOS transistor N26 to provide the voltage at the first node MB_N to the sense node SO. For example, the first data transfer signal MTRAN may have the same voltage level as $V_{clamp}$, ranging from 0 V to 2.3 V. The voltage at the sense node SO is provided to the bit line in response to the sense signal PBSENSE having the voltage level of HIGH. The HIGH voltage may have the voltage level of, e.g., 4.5 V. In this way, Path 1 is formed between the first node MB_N and the bit line. Through Path 1, the voltage of the first node MB_N (corresponding to the first data of 0) may be provided to the bit line to thereby program the bit line to a programming state of, e.g., "To be programmed."

When the combination of the first data and the second data (first data, second data) is (1, 1), the clamp voltage $V_{clamp}$ is provided to the bit line through Path 2. In case of (1, 1), the clamp voltage $V_{clamp}$ is provided to the NMOS transistor N32 in response to the second data "1" (corresponding to HIGH voltage at the third node TB). The NMOS transistor N32 may couple the NMOS transistor N33 to the NMOS transistor N31 in response to the first data "1" (corresponding to HIGH voltage at the first node MB_N). The NMOS transistor N31 may provide an intermediate voltage $V_a$ (corresponding to the clamp voltage $V_{clamp}$) to the sense node SO in response to a dynamic program signal DPGM. For example, the dynamic program signal DPGM may have a voltage level of $V_{cc}$ having the value of, e.g., 2.3V. The voltage at the sense node SO is provided to the bit line in response to the sense signal PBSENSE having the voltage level of HIGH. In this way, Path 2 is formed between the clamp node and the bit line to thereby provide the clamp voltage $V_{clamp}$ to the bit line to thereby program the bit line to a programming state of, e.g., "To be programmed slowly."

When the combination of the first data and the second data (first data, second data) is (1, 0), the bias voltage TBIAS is provided to the bit line through Path 3. In case of (1, 0), the bias voltage TBIAS is provided to the sense node SO in response to the second data (corresponding to the voltage at the third node TB) and the third data transfer signal TTRAN having the voltage level of LOW (e.g., 0V). The voltage at the sense node SO is provided to the bit line in response to the sense signal PBSENSE having the voltage level of HIGH. In this way, Path 3 is formed between the bias node and the bit line to thereby provide the bias voltage TBIAS to the bit line to thereby program the bit line to a programming state of, e.g., "Inhibited from being programmed." The bias voltage TBIAS may have a voltage level that is determined by subtracting the power supply voltage $V_{cc}$ by α. The parameter α has a predetermined value that is determined through experiments, and for example, can range from 0.1 multiplied by $V_{cc}$ to 0.2 multiplied by $V_{cc}$.

The bit line voltage provided to the bit line may indicate the programming state of the bit line. For example, the programming state could be one of "To be programmed," "Inhibited from being programmed," and "To be programmed slowly," which correspond to bit line voltages 0V, $V_{cc}$-α, and $V_a$, respectively. For example, the pair of the first data and the second data (0, 1) may be stored at the first latch and the second latch to program the bit line to the state "To be programmed." The pair of the first data and the second data (1, 0) may be stored at the first latch and the second latch to program the bit line to the state "Inhibited from being programmed." The pair of the first data and the second data (1, 1) may be stored at the first latch and the second latch to program the bit line to the state "To be programmed slowly." Each bit line in the memory cell array 140 is coupled to a respective page buffer 160. After the program data (the main data and the temp data) have been stored at a first node MB_N of the PGM unit 410 and at a third node TB of the NPGM unit 409 associated with each bit line, the bit line setup operation may be carried out concurrently, e.g. simultaneously, on several bit lines. The appropriate voltage (for programming, slowly programming or program inhibiting) is directly provided to each bit line depending on the program data, without a need to bias the bit line to other voltages in the sequence of charging and discharging. The bit line setup time is therefore reduced and the overall programming time is also reduced, especially if multiple step programming is necessary, such as in multi-level memory cells.

After the bit line setup operation is completed, the bit line compensation operation may be performed. When the bit line is programmed to be "Inhibited from being programmed" (e.g., when the bias voltage TBIAS having the voltage level of $V_{cc}$-α is provided to the bit line through Path 3 in response to the pair of the first data and the second data is (1, 0)), the bias voltage TBIAS is increased by α to thereby restore the bias voltage TBIAS to $V_{cc}$, as illustrated in FIG. 6. The first data transfer signal MTRAN and the dynamic program signal DPGM change into LOW to disconnect Path 1 and Path 2. In this way, the bias voltage TBIAS having the voltage level $V_{cc}$ can be provided to the bit line through Path 3. The bit line voltage provided to neighboring bit lines (i.e., adjacent to the bit line for which the bit line voltage has been increased to $V_{cc}$) can be increased according to the bit line voltage provided to those neighboring bit lines. For example, when the bit line voltage provided to the neighboring bit line is $V_a$ or 0V (corresponding to the programming states of "To be programmed slowly" or "Programmed," respectively), the bit line voltage provided to the neighboring bit line is increased by β to make the bit line voltage to be $V_a$+β and β respectively (see FIG. 4). The parameter β has a value that can be determined by experiments, and can be less than the parameter cc. When the bit line voltage provided to the neighboring bit line is $V_{cc}$-α (corresponding to the programming states of "Inhibited from being programmed"), the bit line voltage provided to the neighboring bit line can be increased by α to make the bit line voltage $V_{cc}$. In this way, it is possible to compensate for the influence of the bit line programming of a target bit line to adjacent cells in its neighboring bit line.

Figure 7:
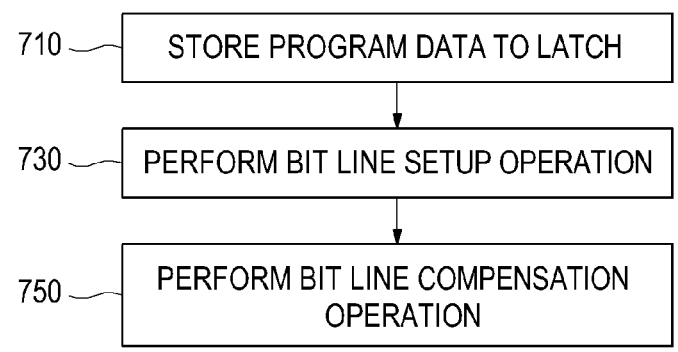
FIG. 7 shows an example flow chart of an illustrative embodiment of a bit line setup method.

FIG. 7 shows an example flow chart of an illustrative embodiment of a bit line setup method. A non-volatile memory device (e.g., the non-volatile memory device 100) may store program data to a latch unit in a page buffer circuit of the non-volatile memory device (block 710). For example, the data latch unit 405 may temporarily store first data at a first node MB_N. A voltage corresponding to the first data may be provided to the first node MB_N through the operations of the data set unit 406, and the sense node sense unit 407. The NMOS transistor N35 that serves as a dynamic second latch may store second data corresponding to the voltage at the third node TB. In this way, the combination of program data (first data corresponding to the voltage at the first node MB_N, and second data corresponding to the voltage at the third node TB) may be stored at the first node MB_N and the third node TB.

A page buffer of the non-volatile memory device (e.g., the page buffer 160) may perform a bit line setup operation to provide a bit line voltage to a bit line BL based on the program data (block 730). The bit line voltage may be programmed, in one step (e.g. a single step), to one of multiple levels, including a program voltage (e.g., ground voltage $V_{SS}$), an intermediate voltage $V_a$, and a bias voltage TBIAS, such as according to the combination of the first data and the second data. When the combination of the first data and the second data (first data, second data) is (0, 1), the first node MB_N (having the voltage level of 0V) is coupled to the bit line through Path 1 of FIG. 5, thereby providing the program voltage ($V_{SS}$) to the bit line BL. When the combination of the first data and the second data (first data, second data) is (1, 1), the clamp voltage $V_{clamp}$ is provided to the bit line BL through Path 2 of FIG. 5. When the combination of the first data and the second data (first data, second data) is (1, 0), the bias voltage TBIAS is provided to the bit line through Path 3 of FIG. 5. The bit line voltage provided to the bit line may indicate the programming state of the bit line. For example, the programming state could be one of "To be programmed," "Inhibited from being programmed," and "To be programmed slowly," which correspond to bit line voltages 0V, $V_{cc}$-α, and $V_a$, respectively.

After the bit line setup operation is completed, the bit line compensation operation may be performed. When the bit line voltage has the voltage level of the bias voltage TBIAS (e.g., when the bit line is programmed to be "Inhibited from being programmed"), the page buffer 160 may increase the bias voltage TBIAS to a power supply voltage $V_{cc}$. In this way, the bias voltage TBIAS having the voltage level $V_{cc}$ can be provided to the bit line through Path 3.

Figure 8:
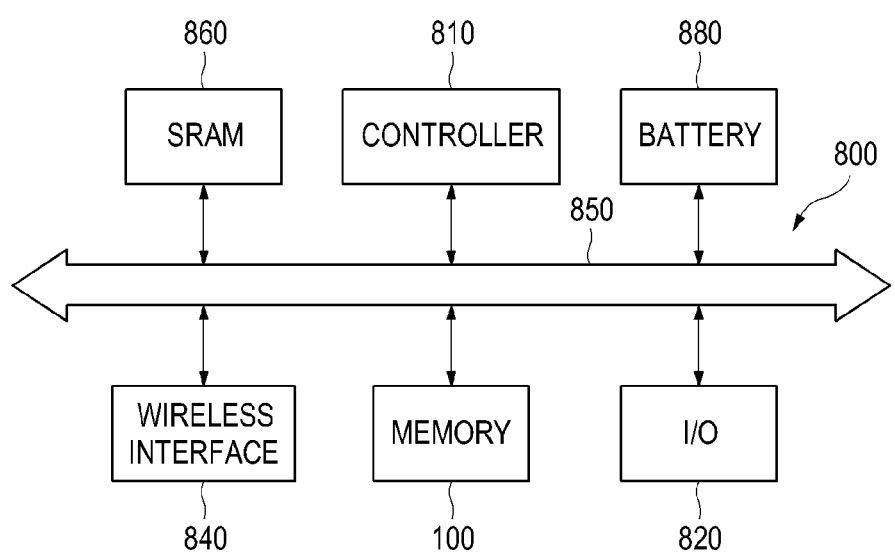
FIG. 8 shows a schematic diagram of an illustrative embodiment of a system including a non-volatile memory device.

FIG. 8 shows a schematic diagram of an illustrative embodiment of a system including a non-volatile memory device (e.g., a memory device 100 of FIG. 1). A system 800 may be used in devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information either wirelessly or over a wire connection. The system 800 may be used in any of the following systems: a wireless local area network (WLAN) system, a wireless personal area network (WPAN) system, or a cellular network.

The system 800 may include a controller 810, an input/output (I/O) device 820 (e.g., a keypad, display), the non-volatile memory device 100 of FIG. 1, a wireless interface 840, and a static random access memory (SRAM) 860 and coupled to each other via a bus 850. A battery 880 may provide power to the system 800 in one embodiment. The memory device may include a NAND memory, a flash memory, a NOR memory, or the like.

The controller 810 may include, for example, one or more microprocessors, digital signal processors, micro-controllers, or the like. The non-volatile memory device 100 may be used to store messages transmitted to or by the system 800. The non-volatile memory device 100 may also optionally be used to store instructions that are executed by controller 820 during the operation of the system 800, and may be used to store user data either provided, collected or received by the system 800 (such as image data). The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information.

The I/O device 820 may be used to provide a message. The system 800 may use the wireless interface 840 to transmit and receive messages to and from a wireless communication network with a radio frequency (RF) signal. Examples of the wireless interface 840 may include an antenna, or a wireless transceiver, such as a dipole antenna, although the scope of the present invention is not limited in this respect. Also, the I/O device 820 may deliver a voltage reflecting what is stored as either a digital output (if digital information was stored), or as analog information (if analog information was stored). While an example in a wireless application is provided above, embodiments of the present invention may also be used in non-wireless applications as well.

In light of the present disclosure, those skilled in the art will appreciate that the apparatus and methods described herein may be implemented in hardware, software, firmware, middleware or combinations thereof and utilized in systems, subsystems, components or sub-components thereof. For example, a method implemented in software may include computer code to perform the operations of the method. This computer code may be stored in a machine-readable medium such as a processor-readable medium or a computer program product, or transmitted as a computer data signal embodied in a carrier wave, or a signal modulated by a carrier, over a transmission medium or communication link. The machine-readable medium or processor-readable medium may include any medium capable of storing or providing information in a form readable and executable by a machine (e.g., by a processor, a computer, etc.).

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," or the like include the number recited and refer to ranges which can be subsequently broken down into subranges as discussed above.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An apparatus comprising:
a memory cell array including a memory cell configured to be coupled to a bit line;
a control circuit configured to provide a control signal;
a voltage generator configured to provide a sense signal and a precharge signal in response to the control signal; and
a page buffer configured to provide, in a single step, a bit line voltage to the bit line based on the sense signal and the precharge signal to control a programming of the memory cell, a value of the bit line voltage to be selected based on program data, the buffer including a
program unit including a data latch unit configured to store first data, and
a non-program unit configured to store second data, the combination of the first data and the second data forming the program data, the non-program unit being further configured to
provide a bias voltage as the bit line voltage based on the program data, and
increase the bias voltage based on the program data.

2. The apparatus of claim 1, wherein the page buffer further comprises a dynamic program unit configured to provide an intermediate voltage as the bit line voltage based on the program data.

3. The apparatus of claim 1, wherein the program unit is configured to provide a program voltage as the bit line voltage based on the program data.

4. The apparatus of claim 1, wherein the page buffer comprises a bit line selection unit coupled to the bit line of the memory cell array.

5. The apparatus of claim 1, wherein the page buffer is configured to increase the bias voltage when the bit line is to be inhibited from being programmed.

6. The apparatus of claim 1, wherein the voltage generator comprises a page buffer operation voltage generator coupled between the control circuit and the page buffer.

7. The apparatus of claim 1, wherein the page buffer is configured to pre-charge the bit line in response to the pre-charge signal.

8. The apparatus of claim 1, wherein the bit line voltage indicates a programming state of the bit line.

9. The apparatus of claim 8, wherein the programming state of the bit line comprises one of "To be programmed," "Inhibited from being programmed," and "To be programmed slowly."

10. The apparatus of claim 1, wherein the memory cell array has an all-bit line structure.

11. The apparatus of claim 1, the apparatus comprises a flash memory device.

12. A method, comprising:
storing program data to a latch unit;
providing a bit line voltage to a bit line based on the program data; and
based on a value of the stored program data, selecting the bit line voltage from a one of a group of voltages comprising a program voltage, an intermediate voltage, and a bias voltage, the providing the bit line voltage to the bit line comprises providing the bit line voltage selected from the program voltage, the intermediate voltage, and the bias voltage in a single step.

13. The method of claim 12, wherein the bit line voltage comprises the bias voltage and further comprising increasing the bias voltage to a power supply voltage.

14. The method of claim 12, wherein the providing the bit line voltage to a bit line based on the program data stored in the latch unit comprises providing a first bit line voltage to a first bit line based on first program data stored in a first latch unit, and further comprising concurrently providing a second bit line voltage, different from the first bit line voltage, to a second bit line based on second program data stored in a second latch unit.

15. The method of claim 12, wherein providing the bit line voltage comprises determining a programming state of the bit line based on the program data; and providing a voltage level to the bit line according to the programming state.

16. The method of claim 15, wherein the programming state of the bit line comprises one of "To be programmed," "Inhibited from being programmed," and "To be programmed slowly."

17. An apparatus comprising
 a program unit configured to selectively provide a program voltage to a bit line based on program data,
 a dynamic program unit configured to selectively provide an intermediate voltage to the bit line based on the program data, and
 a non-program unit configured to selectively provide a bias voltage to the bit line based on the program data, the non-program unit being further configured to increase the bias voltage based on the program data.

18. The apparatus of claim 17, wherein the program unit comprises a latch unit configured to store the program data.

19. A tangible processor-readable storage medium storing instructions that, when executed by a processor, cause the processor to perform operations comprising:
 storing program data to a latch unit;
 providing a bit line voltage to a bit line based on the program data; and
 based on a value of the stored program data, selecting the bit line voltage from a one of a group of voltages comprising a program voltage, an intermediate voltage, and a bias voltage, the providing the bit line voltage to the bit line comprises providing the bit line voltage selected from the program voltage, the intermediate voltage, and the bias voltage in a single step.

* * * * *

UNITED STATES PATENT AND TRADEMARK OFFICE
CERTIFICATE OF CORRECTION

PATENT NO.        : 8,743,623 B2
APPLICATION NO.   : 13/195548
DATED             : June 3, 2014
INVENTOR(S)       : Myung Cho et al.

Page 1 of 1

It is certified that error appears in the above-identified patent and that said Letters Patent is hereby corrected as shown below:

In the Claims

In column 12, line 18, in Claim 1, after "the" insert -- page --.

Signed and Sealed this
Twenty-sixth Day of August, 2014

Michelle K. Lee
*Deputy Director of the United States Patent and Trademark Office*